United States Patent
Hasebe et al.

(10) Patent No.: US 7,611,995 B2
(45) Date of Patent: Nov. 3, 2009

(54) METHOD FOR REMOVING SILICON OXIDE FILM AND PROCESSING APPARATUS

(75) Inventors: Kazuhide Hasebe, Tokyo-To (JP); Mitsuhiro Okada, Tokyo-To (JP); Takashi Chiba, Tokyo-To (JP); Jun Ogawa, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 118 days.

(21) Appl. No.: 10/552,262

(22) PCT Filed: Apr. 20, 2004

(86) PCT No.: PCT/JP2004/005643

§ 371 (c)(1), (2), (4) Date: Oct. 5, 2005

(87) PCT Pub. No.: WO2004/095559

PCT Pub. Date: Nov. 4, 2004

(65) Prior Publication Data

US 2006/0216941 A1    Sep. 28, 2006

(30) Foreign Application Priority Data

Apr. 22, 2003    (JP) .............................. 2003-117664

(51) Int. Cl.
*H01L 21/302* (2006.01)

(52) U.S. Cl. .................. 438/723; 438/714; 438/715; 438/745; 438/756

(58) Field of Classification Search ................ 438/706, 438/710, 712, 714, 723, 745, 756, 720
See application file for complete search history.

(56) References Cited

U.S. PATENT DOCUMENTS

| | | | | |
|---|---|---|---|---|
| 5,030,319 A | * | 7/1991 | Nishino et al. | 216/87 |
| 5,268,069 A | * | 12/1993 | Chapple-Sokol et al. | 216/73 |
| 5,282,925 A | * | 2/1994 | Jeng et al. | 216/59 |
| 5,380,399 A | | 1/1995 | Miyashita et al. | |

(Continued)

FOREIGN PATENT DOCUMENTS

CN    1088272    6/1994

(Continued)

OTHER PUBLICATIONS

English translation of Chinese Office Action dated May 18, 2007 issued in connection with CN Application No. 2004800110434.

(Continued)

*Primary Examiner*—Lan Vinh
(74) *Attorney, Agent, or Firm*—Smith, Gambrell & Russell, LLP

(57) ABSTRACT

A silicon dioxide film removing method is capable of removing a silicon dioxide film, such as a natural oxide film or a chemical oxide film, at a temperature considerably higher than a room temperature. The silicon dioxide film removing method of removing a silicon dioxide film formed on a workpiece in a processing vessel 18 that can be evacuated uses a mixed gas containing HF gas and $NH_3$ gas for removing the silicon dioxide film. The silicon dioxide film can be efficiently removed from the surface of the workpiece by using the mixed gas containing HF gas and $NH_3$ gas.

8 Claims, 9 Drawing Sheets

U.S. PATENT DOCUMENTS

| | | | |
|---|---|---|---|
| 6,335,261 B1 * | 1/2002 | Natzle et al. | 438/435 |
| 6,635,185 B2 * | 10/2003 | Demmin et al. | 216/64 |
| 2002/0063110 A1 * | 5/2002 | Cantell et al. | 216/51 |
| 2004/0161890 A1 * | 8/2004 | Song et al. | 438/240 |

FOREIGN PATENT DOCUMENTS

| | | |
|---|---|---|
| JP | 03-140453 | 6/1991 |
| JP | 03-147322 | 6/1991 |
| JP | 05-326464 | 12/1993 |
| JP | 06-97140 | 4/1994 |
| JP | 06-181188 | 6/1994 |
| JP | 06-224153 | 8/1994 |
| JP | 08-195381 | 7/1996 |
| JP | 2002-176052 | 6/2002 |

OTHER PUBLICATIONS

Notification of Transmittal of Copies of Translation of the International Preliminary Report on Patentability (Form PCT/IB/338)—PCT/JP2004/005643, dated Jan. 2004.

PCT International Preliminary Report on Patentability (Form PCT/IB/373)—PCT/JP2004/005643, dated Jan. 2004.

Translation of PCT Written Opinion of the International Searching Authority (PCT/ISA/237) dated Jan. 2004.

* cited by examiner

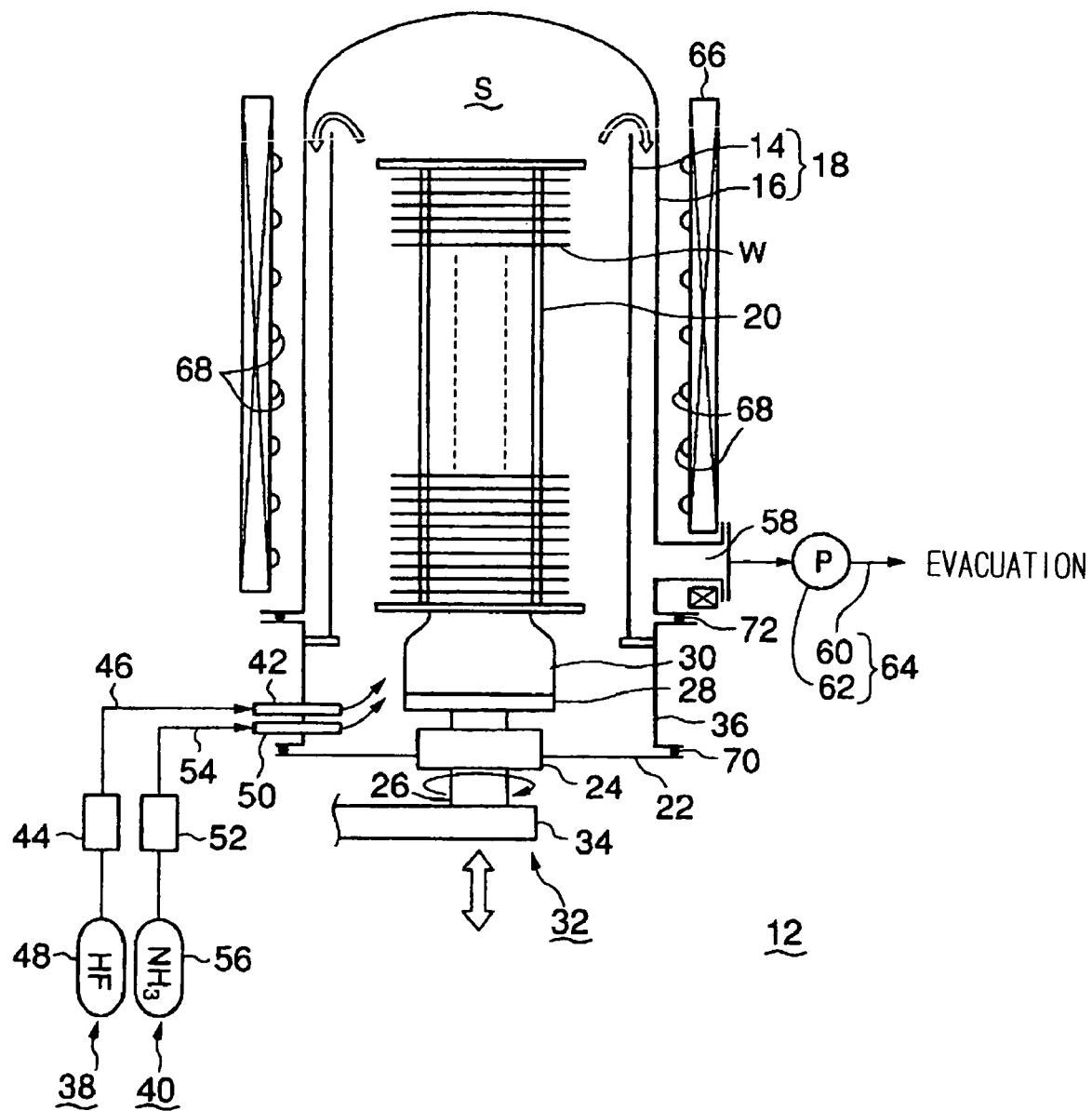
F I G. 1

<ETCH SELECTIVITY FOR CHEMICAL OXIDE FILM>

| TEMPERATURE °C | PRESSURE Torr | HF sccm | NH₃ sccm | CHEMICAL OXIDE FILM nm | POLYSILICON FILM nm | SiN nm | | TEOS (SiO₂) nm | | THERMAL OXIDE FILM (SiO₂) nm | |
|---|---|---|---|---|---|---|---|---|---|---|---|
| 100 | VAC | 182 | 1820 | 0.16 | 0 | 0.23 | | 0.79 | | 0.10 | ○ |
|  | 7.6 | 1820 | 182 | 0 | 0 | 6.20 | | 15.37 | | 12.52 | |
|  | 400 | 1000 | 1000 | 0 | 1.29 | 16.61 | | 35.07 | | 40.78 | |
| 300 | VAC | 1820 | 182 | 0.12 | 0 | 0.14 | | 0.53 | | 0.08 | |
|  | 7.6 | 1000 | 1000 | 0.22 | 0 | 0.05 | ○ | 0 | | 0.01 | ○ |
|  | 150 | 182 | 1820 | 0.42 | 0 | 0.26 | | 0.37 | | 0.03 | ○ |
|  | 400 | 182 | 1820 | 0.58 | 0 | 0.61 | | 1.19 | | 0.27 | ○ |
|  |  | 1000 | 1000 | 0.61 | 0 | 1.99 | | 11.02 | | 1.71 | |
|  |  | 1820 | 182 | | | 3.22 | | 93.90 | | 2.28 | |
| 400 | VAC | 1000 | 1000 | 0.16 | 0.04 | 0.01 | ○ | 0 | ○ | 0 | ○ |
|  | 7.6 | 182 | 1820 | 0.10 | 0 | 0.03 | | 0.07 | | 0 | ○ |
|  | 400 | 1820 | 182 | 0.35 | 0 | 5.42 | ○ | 0.55 | ○ | 0.07 | ○ |
| 600 | VAC | 1000 | 1000 | 0.18 | 1.35 | 0.08 | ○ | 0.57 | | 0 | ○ |
|  | 7.6 | 182 | 1820 | 0.10 | 0.40 | 0.10 | | 0.40 | | 0.02 | ○ |
|  | 400 | 1820 | 182 | — | — | 12.43 | | 0 | | 8.62 | ○ |

<1Torr=133Pa>

FIG. 5

| | TEMPERATURE | PRESSURE | TIME | HF | NH₃ | POLYSILICON FILM | | SiN | | TEOS | | THERMAL OXIDE FILM | | CHEMICAL OXIDE FILM | |
|---|---|---|---|---|---|---|---|---|---|---|---|---|---|---|---|
| | °C | Torr | min | (sccm) | (sccm) | TOP | BTM | TOP | BTM | TOP | BTM | TOP | BTM | TOP | BTM |
| HF:NH₃=1:10 | 200 | 150 | 10 | 182 | 1820 | 0 | 0 | 0.58 | 0.63 | 9.04 | 24.07 | 0.90 | 2.03 | 0.57 | 0.56 |
| HF:NH₃=1:20 | 200 | 150 | 10 | 91 | 1820 | 0 | 0 | 0.12 | 0.15 | 3.22 | 8.50 | 0.14 | 0.25 | 0.56 | 0.57 |
| HF:NH₃=1:50 | 200 | 150 | 10 | 36 | 1820 | 0.03 | 0.09 | 0.03 | 0.04 | 2.02 | 2.19 | 0.07 | 0.08 | 0.41 | 0.47 |

FIG. 6

METHOD FOR REMOVING SILICON OXIDE FILM AND PROCESSING APPARATUS

TECHNICAL FIELD

The present invention relates to a method of removing a silicon dioxide film formed on a surface of a workpiece, such as a semiconductor wafer, and a processing system.

BACKGROUND ART

Generally, a semiconductor wafer, such as a silicon substrate, is subjected to various processes including a film forming process, an etching process, an oxidizing process, a diffusion process and modification process to fabricate a semiconductor integrated circuit on the semiconductor wafer. When the semiconductor wafer is carried from one processing vessel for the preceding process to another processing vessel for the succeeding process, the semiconductor wafer is exposed to a clean atmosphere. Oxygen and moisture contained in the atmosphere react with active silicon atoms exposed on the surface of the wafer and form a natural oxide film of $SiO_2$. The natural oxide film deteriorates electrical properties. Therefore, the natural oxide film is removed by a wet cleaning process using, for example, an HF solution before subjecting the semiconductor wafer to the next process. A film removing method disclosed in Patent document 1 removes a silicon dioxide film of a different quality selectively with HF gas at a room temperature.

The surface of the wafer from which the natural oxide film has been removed by the cleaning process is highly active. Therefore, if the wafer is exposed to the atmosphere, a natural oxide film ($SiO_2$ film) is formed again. To avoid the reformation of a natural oxide film on the wafer, the wet surface of the wafer from which the natural oxide film has been removed is processed by a chemical process to form a chemical oxide film ($SiO_2$ film) on the cleaned surface of the wafer, the wafer coated with the chemical oxide film is carried to the processing vessel of the next process, and the wafer coated with the chemical oxide film is processed. The chemical oxide film has excellent electrical properties as compared with the natural oxide film and is formed uniformly on the surface of the wafer. Therefore, when the next process is a gate oxide film forming process, a thermal oxide film ($SiO_2$ film) is formed directly on the wafer.

A series of steps of the foregoing processing method of processing the surface of a semiconductor wafer will be described with reference to FIG. 10. It is supposed that the processing method is applied to forming a thermal oxide film ($SiO_2$ film), for example, to be used as a gate oxide film on the surface of a semiconductor wafer.

Referring to FIG. 10(A), a surface of a semiconductor wafer W, such as a silicon substrate, is exposed to the atmosphere. Consequently, a natural oxide film 2 ($SiO_2$ film) having an irregular thickness and inferior electrical properties is formed on a surface of the semiconductor wafer W through the interaction of oxygen and steam (moisture) contained in the atmosphere and silicon atoms. As shown in FIG. 10(B), the semiconductor wafer W is subjected to a wet cleaning process using an HF solution to remove the natural oxide film 2 from the surface of the semiconductor wafer W, the surface of the wafer W exposed by removing the natural oxide film 2 is highly active and a natural oxide film is readily formed again on the wafer W.

To prevent the reformation of a natural oxide film on the wafer W, the wafer W is subjected to a chemical process using a solution prepared by mixing, for example, $H_2O_2$ and $NH_4OH$ after the removal of the natural oxide film 2 to form a protective chemical oxide film ($SiO_2$ film) 4 by lightly oxidizing the surface of the wafer W as shown in FIG. 10(C). The chemical oxide film 4 is superior in electrical properties to the natural oxide film 2 and is uniform and very thin. The thickness L of the chemical oxide film 4 is in the range of about 0.7 to about 0.9 nm.

Then, as shown in FIG. 10(D), the wafer W is carried to, for example, a thermal oxidation system and is subjected to a thermal oxidation process to form a thermal oxide film ($SiO_2$ film) 6 (refer to, for example, Patent documents 2 and 3). The thermal oxide film 6 is processed by a patterning etching process to use the thermal oxide film 6 as a gate oxide film. The thermal oxide film 6 is sandwiched between the silicon surface of the wafer W and the chemical oxide film 4.

Patent document 1: JP 6-181188 A
Patent document 2: JP 3-140453 A
Patent document 3: JP 2002-176052

The thickness of a film in one layer has been progressively decreased to cope with the further advancement of the complexity of integration and dimensional reduction of semiconductor integrated circuits. Under such circumstances, it is desired to control skillfully processes for forming, for example, gate oxide films to form gate oxide films in a desired thickness in the range of, for example, 1.0 to 1.2 nm.

Although the chemical oxide film 4 has the very small thickness L in the range of about 0.7 to about 0.9 nm, the ratio of the thickness L of the chemical oxide film to the thickness of the gate oxide film, namely, the sum of the respective thicknesses of the chemical oxide film 4 and the thermal oxide film 6, increases when the desired thickness of the gate oxide film is in the range of about 1.0 to about 1.2 nm. The control of the thickness of such a gate oxide film is difficult. Such a problem resides not only in forming the gate oxide film, but also in forming various kinds of thin film.

The chemical oxide film may be removed by the film removing method using HF gas as mentioned in Patent document 1. However, a process singly using HF gas needs to be carried out at a room temperature. It takes much time to change the temperature of a processing vessel, namely, a vertical furnace, having a large heat capacity in a wide temperature range, which reduces throughput greatly.

DISCLOSURE OF THE INVENTION

The present invention has been made in view of the foregoing problems to solve those problems. Accordingly, it is an object of the present invention to provide a silicon dioxide film removing method and a processing system capable of efficiently removing a silicon dioxide film, such as a natural oxide film or a chemical oxide film, in an atmosphere of a temperature considerably higher than a room temperature.

According to the present invention, a silicon dioxide film removing method of removing a silicon dioxide film formed on a surface of a workpiece in a processing vessel that can be evacuated is characterized in using a mixed gas containing HF gas and $NH_3$ gas for removing the silicon dioxide film.

The silicon dioxide film formed on the surface of the workpiece can be efficiently removed by using the mixed gas containing HF gas and $NH_3$ gas.

In the silicon dioxide film removing method, a processing temperature at which the workpiece is processed is, for example, in the range of 100° C. to 600° C.

In the silicon dioxide film removing method, a processing pressure at which the workpiece is processed is in the range of, for example, 26 to 53,200 Pa (0.2 to 400 torr).

In the silicon dioxide film removing method, the silicon dioxide film is, for example, a chemical oxide film formed by a chemical process, and a processing temperature for achieving etch selectivity for the chemical oxide film to silicon is in the range of, for example, 100° C. to 400° C.

The silicon dioxide film, namely, the chemical oxide film, can be etched and removed by etching at a high degree of etch selectivity.

In the silicon dioxide film removing method, the processing pressure is in the range of, for example, 26 to 53,200 Pa (0.2 to 400 torr).

In the silicon dioxide film removing method, the flow rate ratio of HF gas to $NH_3$ gas is in the range of, for example, 10:1 to 1:50.

In the silicon dioxide film removing method, the silicon dioxide film is, for example, a chemical oxide film formed by a chemical process, and a processing temperature for achieving etch selectivity for the chemical oxide film to a silicon nitride film is in the range of, for example, 200° C. to 600° C.

The silicon dioxide film, namely, the chemical oxide film, can be etched and removed at a high degree of etch selectivity for the chemical oxide film to the silicon nitride film.

In the silicon dioxide film removing method, the silicon dioxide film is, for example, a chemical oxide film formed by a chemical process, and a processing temperature for achieving etch selectivity for the chemical oxide film to a silicon dioxide film formed by decomposing TEOS (tetraethylorthosilicate), which will be referred to as "TEOS silicon dioxide film", is in the range of, for example, 300° C. to 400° C.

The chemical oxide film can be etched and removed at a high degree of etch selectivity for the chemical oxide film to the TEOS silicon dioxide film.

In the silicon dioxide film removing method, The silicon dioxide film is a chemical oxide film formed by a chemical process, and a processing temperature for achieving etch selectivity for the chemical oxide film to the thermal oxide film is in the range of, for example, 100° C. to 600° C.

The chemical oxide film, namely, the silicon dioxide film, can be etched and removed at a high degree of etch selectivity for the chemical oxide film to the thermal oxide film ($SiO_2$).

In the silicon dioxide film removing method, the flow rate ratio of HF gas to $NH_3$ gas is in the range of, for example, 1:10 to 1:50.

In the silicon dioxide film removing method, the processing pressure is, for example, 1011 Pa (7.6 torr) or below.

In the silicon dioxide film removing method, the silicon dioxide film is, for example, a natural oxide film.

According to the present invention, a processing system for carrying out the foregoing silicon dioxide film removing method includes: a processing vessel that can be evacuated; a workpiece holding means for holding workpieces; a heating means for heating the workpieces; an evacuating system for evacuating the processing vessel; an HF gas supply system for supplying HF gas into the processing vessel; and an $NH_3$ gas supply system for supplying $NH_3$ gas into the processing vessel.

The processing system may further include an oxidizing gas supply system for supplying steam or a gas for generating steam into the processing vessel.

The processing system may further include a silicon film forming gas supply system for supplying a silicon film forming gas into the processing vessel.

BRIEF DESCRIPTION OF THE DRAWINGS

FIG. 1 is a schematic sectional view of a processing system for carrying out a silicon dioxide film removing method in a first embodiment according to the present invention;

FIG. 5 is a table showing data on etch selectivity for a chemical oxide film to silicon dioxide films other than the chemical oxide films, and films of silicon-containing materials;

FIG. 6 is a table showing data on etch selectivities for chemical oxide films, silicon dioxide films other than the chemical oxide films, and films of silicon-containing materials;

BEST MODE FOR CARRYING OUT THE INVENTION

Figure 2:
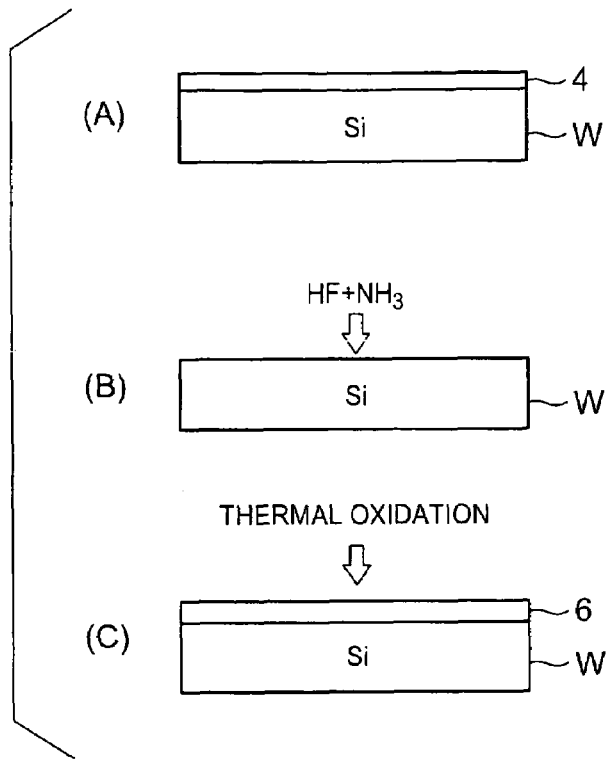
FIG. 2 is a view of assistance in explaining steps of a semiconductor wafer processing process.

A silicon dioxide film removing method in a first embodiment according to the present invention and processing systems for carrying out the same will be described with reference to the accompanying drawings.

FIG. 1 shows a processing system 12 for carrying out a silicon dioxide film removing method in a preferred embodiment according to the present invention. The processing system 12 includes a double-wall, vertical processing vessel 18 of a predetermined length. The processing vessel 18 includes an inner tube 14 of quartz and an outer tube 16 of quartz. The inner tube 14 defines a processing space S. A wafer boat 20 of quartz, namely, a workpiece holding means, is placed in the processing space S. Semiconductor wafers W, namely, workpieces, are held in layers on the wafer boat 20 at predetermined vertical pitches. The pitches may be equal or may be different according to the positions of the wafers W.

A cap 22 closes and opens the lower end of the processing vessel 18. A rotating shaft 26 penetrates the cap 22. A gap between the cap 22 and the rotating shaft 26 is sealed with a magnetic fluid seal 24. A rotating table 28 is supported on the rotating shaft 26. A heat insulating cylinder 30 is mounted on the table 28. The wafer boat 20 is placed on the heat insulating cylinder 30. The rotating shaft 26 is supported on a vertically movable arm 34 included in a boat elevator 32. The rotating shaft 26, the cap 22 and the wafer boat 20 can be simultaneously moved in vertical directions. The wafer boat 20 does not need necessarily to be rotated and may be fixed.

A manifold 36 made of, for example, a stainless steel is joined to the open lower end of the processing vessel 18. An HF gas supply system 38 and an $NH_3$ gas supply system 40 are connected individually to the manifold 36. The HF gas supply system 38 and the $NH_3$ gas supply system 40 supply HF gas and $NH_3$ gas at controlled flow rates, respectively, into the processing vessel 18.

More specifically, the HF gas supply system 38 includes an HF gas nozzle 42 penetrating the manifold 36. A gas supply line 46 provided with a flow controller 44, such as a mass flow controller, has one end connected to the HF gas nozzle 42 and the other end connected to an HF gas source 48.

The $NH_3$ gas supply system 40 includes an $NH_3$ gas nozzle 50 penetrating the manifold 36. A gas supply line 54 provided with a flow controller 52, such as a mass flow controller, has one end connected to the $NH_3$ gas nozzle 50 and the other end connected to an $NH_3$ gas source 56.

HF gas and $NH_3$ gas supplied through the nozzles 42 and 50 into the processing vessel 18 flow upward in the processing space S, namely, a wafer holding space. The flow of the HF gas and the $NH_3$ gas is turned by the top wall of the processing vessel 18 such that the HF gas and the $NH_3$ gas flow downward through an annular space defined by the inner tube 14 and the outer tube 16 and are discharged through a discharge port 58 formed in a lower part of the outer tube 16. The discharge port 58 is connected to a vacuum discharge system 64 including a discharge line 60 and a vacuum pump 62. The vacuum discharge system 64 evacuates the processing vessel 18.

The processing vessel 18 is surrounded by a heat insulating wall 66. A heater 68, namely, a heating means, is installed on the inner surface of the heat insulating wall 66. The heater 68 heats the wafers W held in the processing vessel 18 at a predetermined temperature. Suppose that the wafers W are 8 in. wafers and the number of the wafers W including about twenty dummy wafers held on the wafer boat 20 is on the order of one hundred and fifty. Then, the diameter of the inner tube 14 is in the range of about 260 to about 270 mm, the diameter of the outer tube 16 is in the range of about 275 to about 285 mm and the height of the processing vessel 18 is on the order of 1280 mm.

When the wafers W are 12 in. wafers, and the number of the wafers W held on the wafer boat 20 is in the range of about 25 to about 50, the diameter of the inner tube 14 is in the range of about 380 to about 420 mm, the diameter of the outer tube 16 is in the range of about 440 to about 500 mm and the height of the processing vessel 18 is on the order of 800 mm. Those numerical values are only examples.

A sealing member 70, such as an O ring, is held between the cap 22 and the manifold 36. A sealing member 72, such as an O ring, is held between the upper end of the manifold 36 and the lower end of the outer tube 16. Needless to say that the processing system is provided with an inert gas supply system, not shown, for supplying an inert gas, such as $N_2$ gas.

A silicon dioxide film removing method to be carried out by the processing system will be described.

As shown in FIG. 2(A), a chemical oxide film 4, namely, a silicon dioxide film, is formed on a surface of a semiconductor wafer W. As mentioned above in connection with FIGS. 8(A) and 8(B), the chemical oxide film 4 is formed on the surface of the wafer W after removing a natural oxide film 2 from the surface of the wafer W by a chemical process using a mixed solution of $H_2O_2$ and $NH_4OH$.

The processing system 12 processes the wafer W with the chemical oxide film 4 by an etching process using a mixed gas containing HF gas and $NH_3$ gas to remove the chemical oxide film 4 as shown in FIG. 2(B).

Then, a thermal oxide film 6 for forming, for example, a gate oxide film is formed on the wafer W as shown in FIG. 2(C) by another processing system. A silicon dioxide film removing method in a second embodiment, which will be described later, carries out both a film removing process for removing the chemical oxide film 4 and a film forming process for forming the thermal oxide film 6 by a single processing system.

A film removing method of removing the chemical oxide film 4 by the processing system 12 will be more specifically described.

As shown in FIG. 2(A), a plurality of semiconductor wafers W each having a surface coated with a chemical oxide film 4 are arranged in layers at predetermined pitches on the wafer boat 20. The boat elevator 32 raises the wafer boat 20 upward to load the wafer boat 20 through the lower end of the processing vessel 18 into the processing vessel 18. Then, the processing vessel 18 is sealed. The interior of the processing vessel 18 is heated beforehand at a predetermined temperature. The surfaces of the semiconductor wafers W are coated with the chemical oxide films 4, respectively. Then, the vacuum discharge system 64 is operated to evacuate the processing vessel 18.

At the same time, HF gas is supplied into the processing vessel 18 at a controlled flow rate through the HF gas nozzle 42 of the HF gas supply system 38, and $NH_3$ gas is supplied into the processing vessel 18 at a controlled flow rate through the $NH_3$ gas nozzle 50 of the $NH_3$ gas supply system 40.

The HF gas and the $NH_3$ gas separately supplied into the processing vessel mix together to form a mixed gas as the HF gas and the $NH_3$ gas flow upward in the processing vessel 18. The mixed gas etches and removes the chemical oxide films 4 of the wafers W.

An etching process using this mixed gas is carried out at a processing temperature higher than a room temperature, such as a temperature in the range of 100° C. to 600° C., a processing pressure in the range of, for example, 26 to 53,200 Pa (0.2 to 400 torr).

The silicon dioxide film cannot be removed unless the temperature in the processing vessel 18 is decreased to a temperature near a room temperature when only HF gas is used. The silicon dioxide film, namely, the chemical oxide film, can be removed without decreasing the temperature in the processing vessel 18 to a temperature near a room temperature when the mixed gas containing HF gas and $NH_3$ gas. Consequently, the temperature in the processing vessel 18 can be adjusted in a short time and hence throughput can be increased.

After the chemical oxide films 4 have been removed, a thermal oxide film 6, such as a gate oxide film, is formed on each of the wafers W as shown in FIG. 2(C) by an oxidation process by the processing system 12 when the processing system 12 is provided with members for forming a thermal oxide film. When the processing system 12 is not provided with members for forming a thermal oxide film, the wafers W are carried to another processing system provided with members for forming a thermal oxide film and a thermal oxide film 6 is formed on each of the wafers W by an oxidation process. Even if the gate oxide film needs to be formed in a small thickness in the range of about 1.0 to about 1.2 nm to cope with the further advancement of the complexity of integration and dimensional reduction of semiconductor integrated circuits as mentioned above, the thickness of the thermal oxide film 6 can be satisfactorily controlled.

Figure 3:
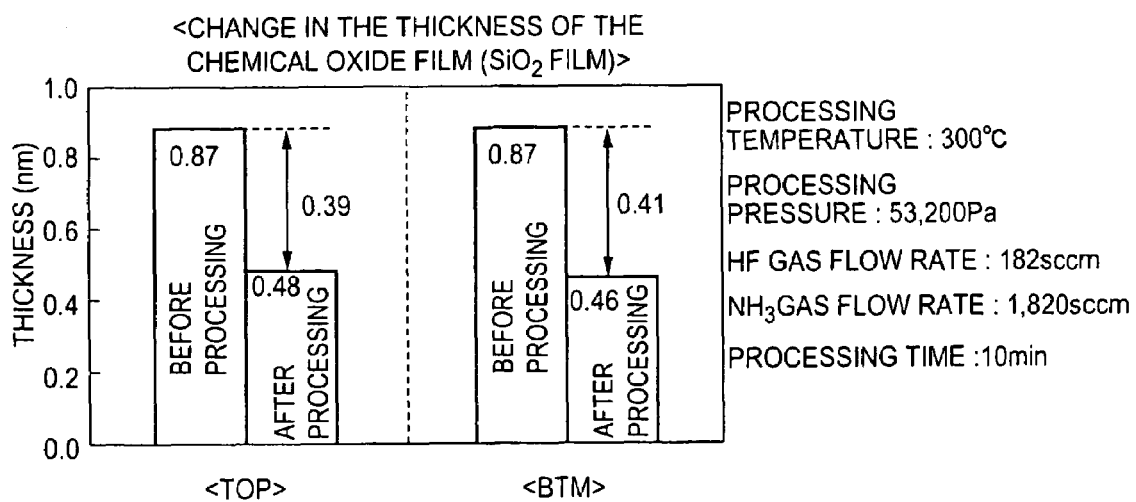
FIG. 3 is a graph showing changes in the thickness of chemical oxide films caused by an etching process.

Results of evaluation of changes in the thickness of the chemical oxide films ($SiO_2$ films) will be described. FIG. 3 is a graph showing changes in the thickness of the chemical oxide films. In FIG. 3, "TOP" and "BTM" indicate the wafers W at a top position and a bottom position, respectively, on the wafer boat 20. The chemical oxide films were etched by an etching process. The etching process used a processing temperature of 300° C., a processing pressure of 53,200 Pa (400 torr), an HF gas flow rate of 182 sccm, an $NH_3$ gas flow rate of 1,820 sccm, a $N_2$ gas flow rate of 8,000 sccm and an etching time of 10 min.

As obvious from FIG. 3, the respective thicknesses of the chemical oxide films of the TOP wafer W and the BTM wafer W are reduced greatly, and the thicknesses of parts, removed in 10 min by etching, of the chemical oxide films were in the range of about 0.39 to about 0.41 nm.

Figure 4:
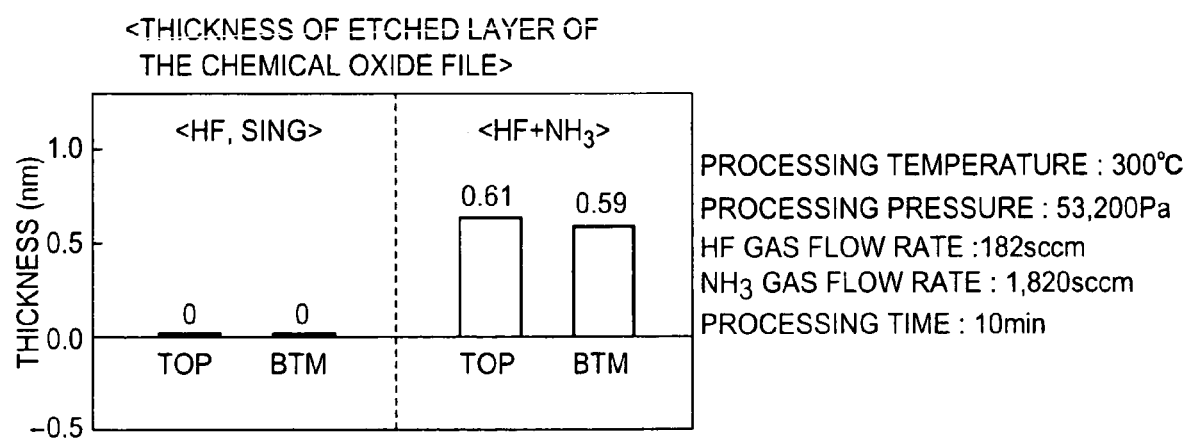
FIG. 4 is a graph showing the $NH_3$ gas dependence of thickness reduction in chemical oxide films.

The effect of the mixed gas containing $NH_3$ gas was examined. Results of examination will be explained. FIG. 4 is a graph showing the $NH_3$ gas dependence of thickness reduction in chemical oxide films. In FIG. 4, thickness reductions when only HF gas was used are shown on the left side and those when the mixed gas containing HF gas and $NH_3$ gas are shown on the right side. The chemical oxide films were etched by an etching process. The etching process used a processing temperature of 300° C., a processing pressure of 53,200 Pa (400 torr), an HF gas flow rate of 182 sccm, an $NH_3$ gas flow rate of 1,820 sccm, a $N_2$ gas flow rate of 8,000 sccm and an etching time of 10 min.

As obvious from FIG. 4, whereas the chemical oxide films were scarcely etched when only HF gas was used, the chemical oxide films were etched by thicknesses in the range of about 0.59 to about 0.61 nm when the mixed gas containing HF gas and $NH_3$ gas was used. Thus it is known that the chemical oxide films cannot be etched unless the etching gas contains $NH_3$ gas.

Selectivities for chemical oxide films, silicon dioxide films other than chemical oxide films and films of silicon-containing materials were examined. FIG. 5 is a table showing data on selectivities for chemical oxide films, silicon dioxide films other than chemical oxide films, and silicon-containing materials. Unit of processing pressure is torr (1 torr=133 Pa). In FIG. 5, circles indicate effective selectivity and a mark "–" signifies that measurement was impossible due to the overetching of Si.

The processing temperature was varied in the range of 100° C. to 600° C. and the processing pressure was varied in the range of 26 to 53,200 Pa (0.2 to 400 torr). The duration of the etching process was 10 min. In FIG. 5, "VAC" indicates a pressure in the evacuated processing vessel 18 in the range of about 26 to about 40 Pa (about 0.2 to about 0.3 torr), which is dependent on the ability of the vacuum pump. The flow rate ratio of HF gas to $NH_3$ gas was varied in the range of 1:10 to 10:1. In FIG. 5, numerical values are thicknesses in nanometer of parts of the films removed in 10 min by the etching process.

Chemical oxide films, silicon films (polysilicon films), silicon nitride films (SiN films), TEOS silicon dioxide films, and thermal oxide films formed by thermal oxidation were examined.

Data on the chemical oxide films shows that, although the thicknesses of etched layers of the chemical oxide films were different, the chemical oxide films could be etched at processing temperatures in the range of 100° C. to 600° C. and at processing pressures in the range of VAC (0.2 torr) to 400 torr. The chemical oxide films could be etched when the processing pressure was VAC and a $NH_3$-rich mixed gas was used, even if the processing temperature was 100° C. Under a condition where the processing temperature was 100° C. and the processing pressure was 7.6 torr or 400 torr and a condition where the processing temperature was 300° C. and the processing pressure was VAC, the chemical oxide films could not be etched because the mixed gas was not $NH_3$-rich. The chemical oxide films could not be etched at all by an etching process using a processing temperature of 50° C., namely, a temperature lower than 100° C., and a mixed gas containing HF gas and $NH_3$ gas. It is known that the processing temperature must be 100° C. or above.

Etch selectivity for the chemical oxide film to polysilicon (Si) will be examined.

As obvious from FIG. 5, the polysilicon films are etched at high etch rates under a condition where the processing temperature is 100° C. and the processing pressure is 400 torr and a condition where the processing temperature is 600° C. and the processing pressure is VAC. Under a condition where the processing temperature is 300° C. or 400° C., the processing temperature is in the range of VAC to 400 torr and the flow rate ratio of HF gas to $NH_3$ gas is in the range of 10:1 to 1:10, the polysilicon films are not etched at all. Thus it is known that the chemical oxide film can be selectively etched relative to polysilicon when the processing temperature is in the range of 300° C. to 400° C.

Etch selectivity for the chemical oxide film to the silicon nitride film will be examined.

As obvious from FIG. 5, the silicon nitride films are etched when the processing temperature is in the range of 100° C. to 600° C. The silicon nitride films are etched at etch rates lower than those at which the chemical oxide films are etched under a condition where the processing temperature is 300° C. and the processing pressure is 7.6 torr, a condition where the processing temperature is 400° C. and the processing pressure is VAC or 7.6 torr and a condition where the processing temperature is 600° C. and the processing pressure is VAC. Thus it is known that the chemical oxide films can be selectively etched relative to the silicon nitride films when the processing temperature is in the range of 300° C. to 600° C. and the processing pressure is 7.6 torr or below.

Etch selectivity for the chemical dioxide film to the TEOS silicon dioxide film will be examined.

As obvious from FIG. 5, the TEOS silicon dioxide films are etched when the processing temperature is in the range of 100° C. to 600° C. The TEOS silicon dioxide films are etched at etch rates lower than those at which the chemical oxide films under a condition where the processing temperature is 300° C. and the processing pressure is 7.6 torr, and a condition where the processing temperature is 400° C. and the processing pressure is VAC or 7.6 torr. Thus it is known that the chemical oxide films can be selectively etched relative to the TEOS silicon dioxide films when the processing temperature is in the range of 300° C. to 400° C. and the processing pressure is 7.6 torr or below.

Etch selectivity for the chemical dioxide film to the thermal oxide film ($SiO_2$ film) formed by thermal oxidation will be examined.

As obvious from FIG. 5, the silicon dioxide films formed by thermal oxidation are etched when the processing temperature is in the range of 100° C. to 600° C. The thermal oxide films formed by thermal oxidation are etched at etch rates lower than those at which the chemical oxide films under a condition where the processing temperature is 100° C. and the processing pressure is VAC, a condition where the processing temperature is 300° C. and the processing pressure is 7.6 torr, 150 torr pr 400 torr, namely a condition where the mixed gas if $NH_3$-rich, a condition where the processing temperature is 400° C. and the processing pressure is in the range of VAC to 400 torr, and a condition where the processing temperature is 600° C. and the processing pressure is VAC or 7.6 torr. Thus it is known that the chemical oxide films can be selectively etched relative to the silicon dioxide films formed by thermal oxidation when the processing temperature is in the range of 100° C. to 600° C.

As obvious from FIG. 5, the mixed gas containing HF gas and $NH_3$ gas is capable of etching not only the chemical oxide films, but also the TEOS silicon dioxide films and the silicon dioxide films formed by thermal oxidation. Thus the mixed gas is capable of etching silicon dioxide films other than the foregoing silicon dioxide films, such as natural oxide films formed on silicon wafers and silicon dioxide films deposited on wafers by thermal CVD processes and plasma CVD processes.

Etch selectivity of $NH_3$-rich mixed gas containing HF gas and $NH_3$ gas will be explained.

Figure 7:
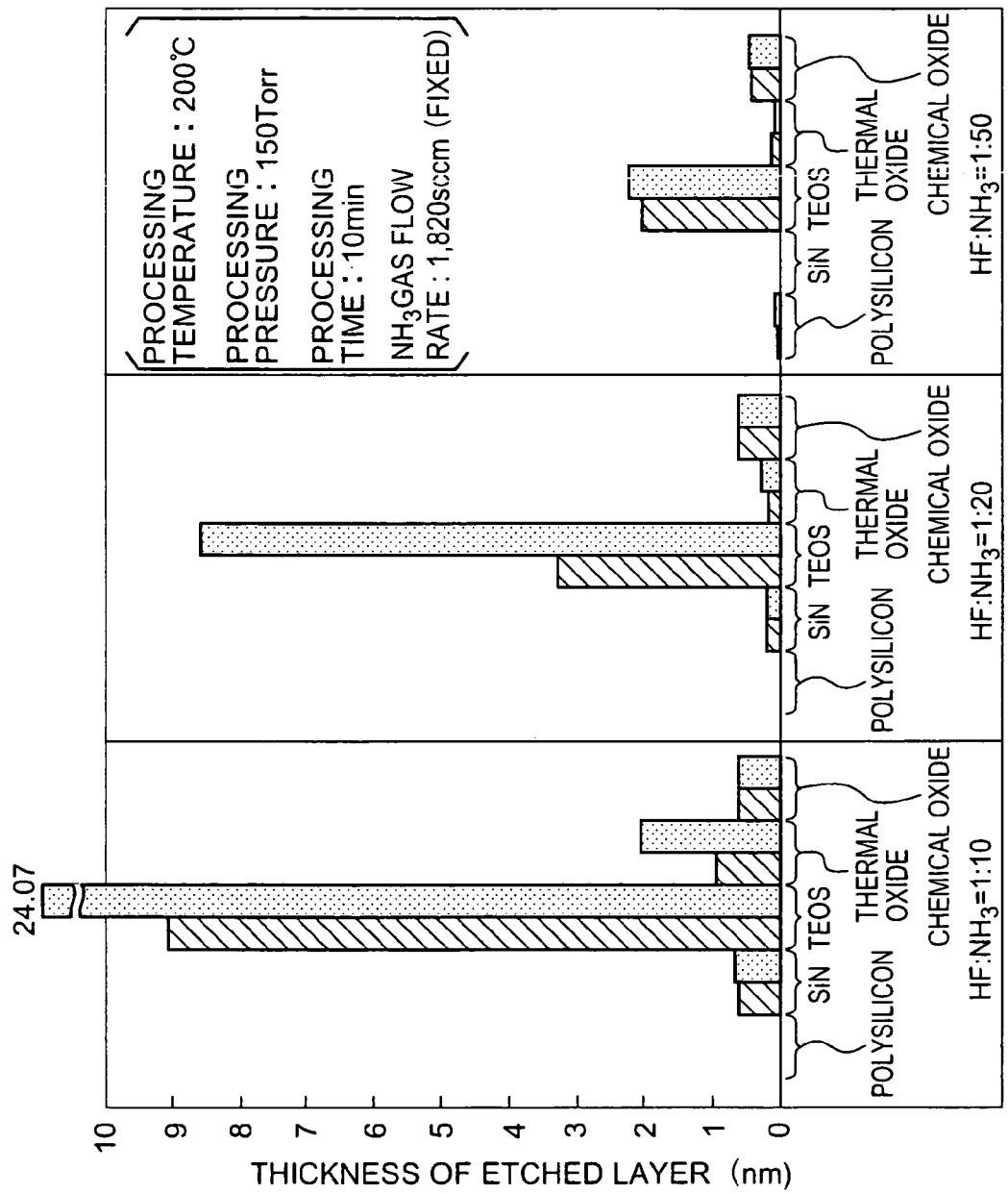
FIG. 7 is a bar graph showing the data on TOP and BTM wafers shown in FIG. 6.

FIG. 6 is a table showing data on etch selectivities for chemical oxide films, silicon dioxide films other than the chemical oxide films, and films of silicon-containing materials, and FIG. 7 is a bar graph showing data on TOP and BTM wafers shown in FIG. 6.

FIG. 6 shows data on films formed by using mixed gases richer in $NH_3$ gas than the mixed gases used for forming the films having properties represented by data shown in FIG. 5. HF gas and $NH_3$ gas were supplied at HF:$NH_3$ flow rate ratios of 1:10, 1:20 and 1:50. The processing temperature was 200° C., and the processing pressure was 150 torr, which were the means of the processing temperatures and processing pressures shown in FIG. 5, respectively. The processing time was 10 min. The flow rate of $NH_3$ gas was fixed at 1,820 sccm and the flow rate of HF gas was changed to change the HF:$NH_3$ flow rate ratio. One hundred and fifty wafers were used.

As obvious from FIGS. 6 and 7, whereas the polysilicon films were etched scarcely when HF gas and $NH_3$ gas were supplied at flow rate ratios of 1:10, 1:20 and 1:50, the chemical oxide films were etched stably and the thicknesses of etched layers of the chemical oxide films were in the range of 0.41 to 0.57 nm.

As obvious from FIGS. 6 and 7, the higher the etch selectivity for the chemical oxide film t the SiN film, the TEOS silicon dioxide film and the thermal oxide film, the smaller is the thickness of the etched layer of the chemical oxide film.

The thicknesses of the etched layers of the SiN film and the thermal oxide film are substantially equal to or greater than that of the etched layer of the chemical oxide film when the HF:$NH_3$ flow rate ratio is 1:10. The thicknesses of the etched layers of the SiN film and the thermal oxide film are considerably smaller than that of the etched layer of the chemical oxide film when the HF:$NH_3$ flow rate ratio is 1:20. The SiN film and the thermal oxide film are etched scarcely when the HF:$NH_3$ flow rate ratio is 1:50.

It is known from the foregoing facts that it is effective to use the mixed gas having the highest possible $NH_3$ concentration to etch the chemical oxide film efficiently while the etching of the SiN film, the TEOS silicon dioxide film and the thermal oxide film is controlled. It is known that a desirable HF:$NH_3$ flow rate ratio is in the range of 1:20 to 1:50

Figure 8:
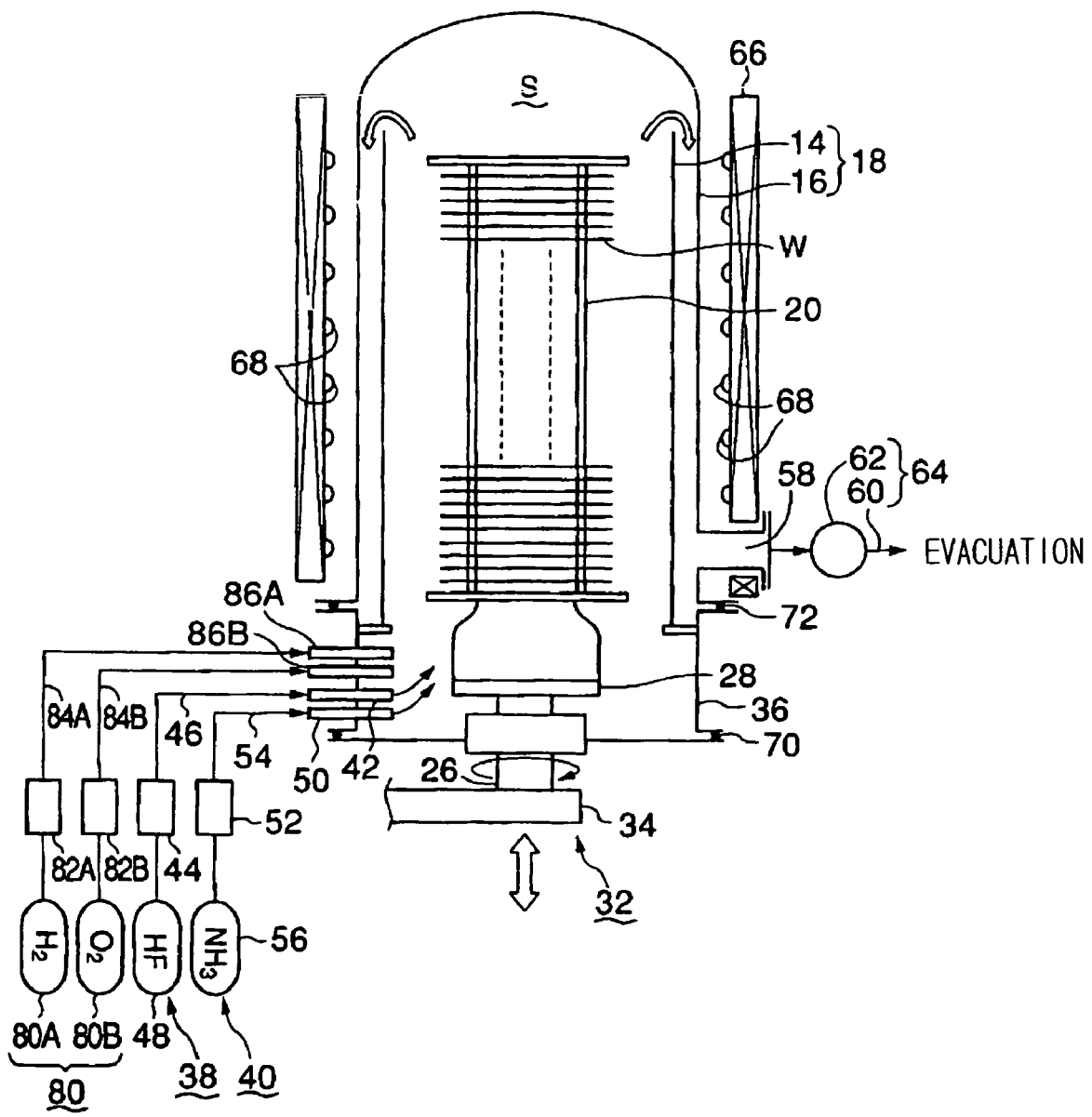
FIG. 8 is a schematic sectional view of a processing system including an oxidizing gas supply system for supplying steam or gases for generating steam.

Although the processing system shown by way of example in FIG. 1 is provided with only the HF gas supply system 38 and the $NH_3$ gas supply system 40 to facilitate understanding, the processing system may be additionally provided with other gas supply systems for other processes. FIG. 8 shows a processing system provided with an oxidizing gas supply system for supplying steam or gases for generating steam. The processing system will be described with reference to FIG. 8, in which parts like or corresponding to those shown in FIG. 1 are denoted by the same reference characters and the description thereof will be omitted.

Referring to FIG. 8, the processing system includes, in addition to an HF gas supply system 38 and an $NH_3$ gas supply system 40, an oxidizing gas supply system 80. The oxidizing gas supply system 80 has an $H_2$ gas source 80A and an $O_2$ gas source 80B. The $H_2$ gas source 80A and the $O_2$ gas source 80B are connected by gas supply lines 84A and 84B respectively provided with flow controllers 82A and 82B to gas nozzles 86A and 86B, respectively. $H_2$ gas and $O_2$ gas are supplied through the gas nozzles 86A and 86B, respectively, into a processing vessel 18.

In the processing vessel 18, $H_2$ gas and $O_2$ gas interact to generate steam. Surfaces of silicon wafers are processed by a thermal oxidation process using the steam to form a thermal oxide film on each of the silicon wafers.

First, the processing system shown in FIG. 8 supplies HF gas and $NH_3$ gas into the processing vessel 18 to remove chemical oxide films covering the surfaces of the silicon wafers. Then, the processing system supplies $H_2$ gas and $O_2$ gas into the processing vessel 18 to generate steam after stopping supplying HF gas and $NH_3$ gas. Then, the processing system carries out a thermal oxidation process using the steam to form a thermal oxide film as a gate oxide film on each of the silicon wafers.

The oxidizing gas supply system 80 may include an external combustor or a steam generator using a catalyst to generate steam and may supply externally generated steam into the processing vessel 18.

A processing system including a silicon film forming gas supply system will be described with reference to FIG. 9, in which parts like or corresponding to those shown in FIG. 1 are denoted by the same reference characters and the description thereof will be omitted.

Figure 9:
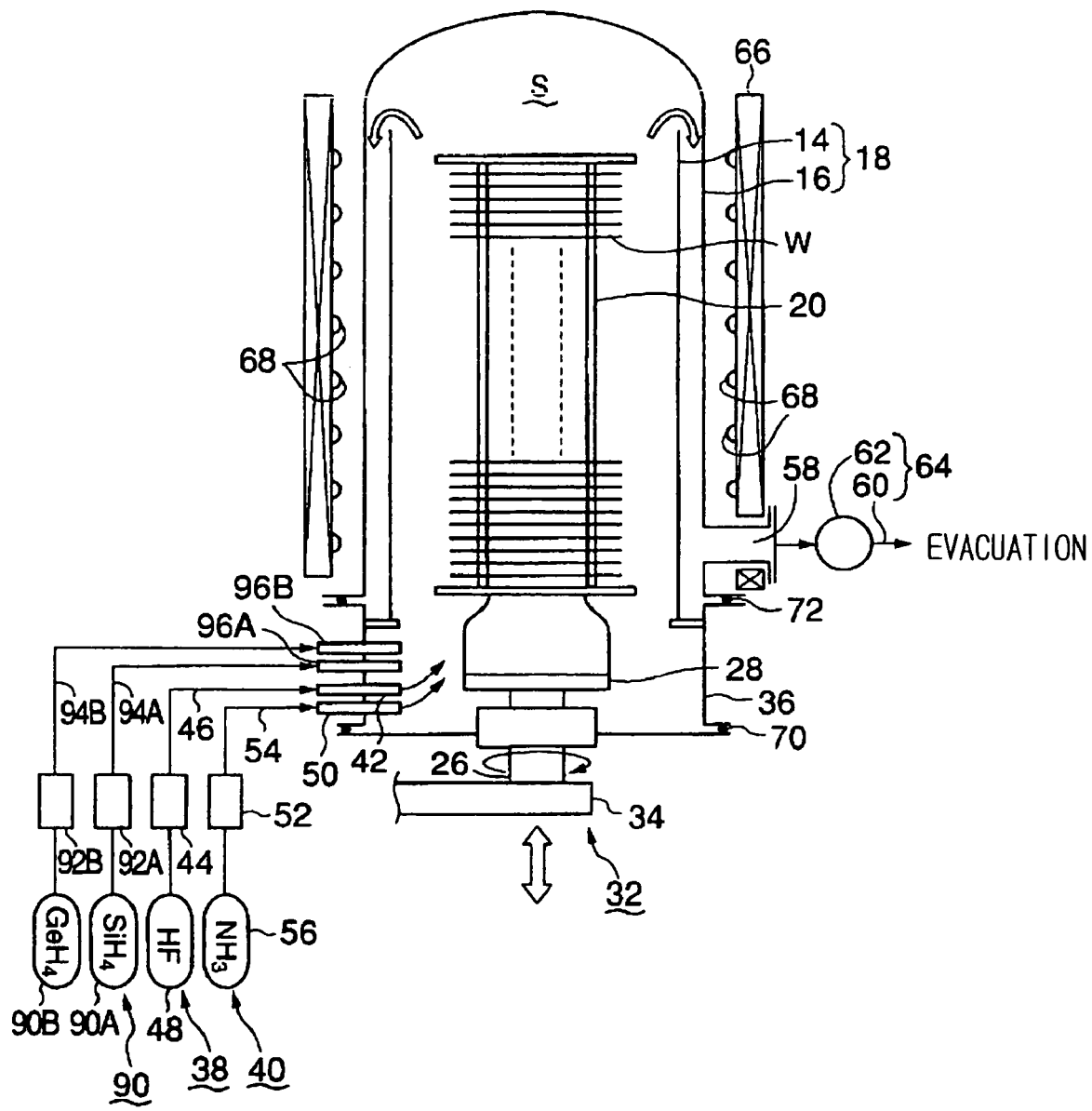
FIG. 9 is a schematic sectional view of a processing system including a silicon film forming gas supply system for supplying gases for forming a silicon film.
Figure 10:
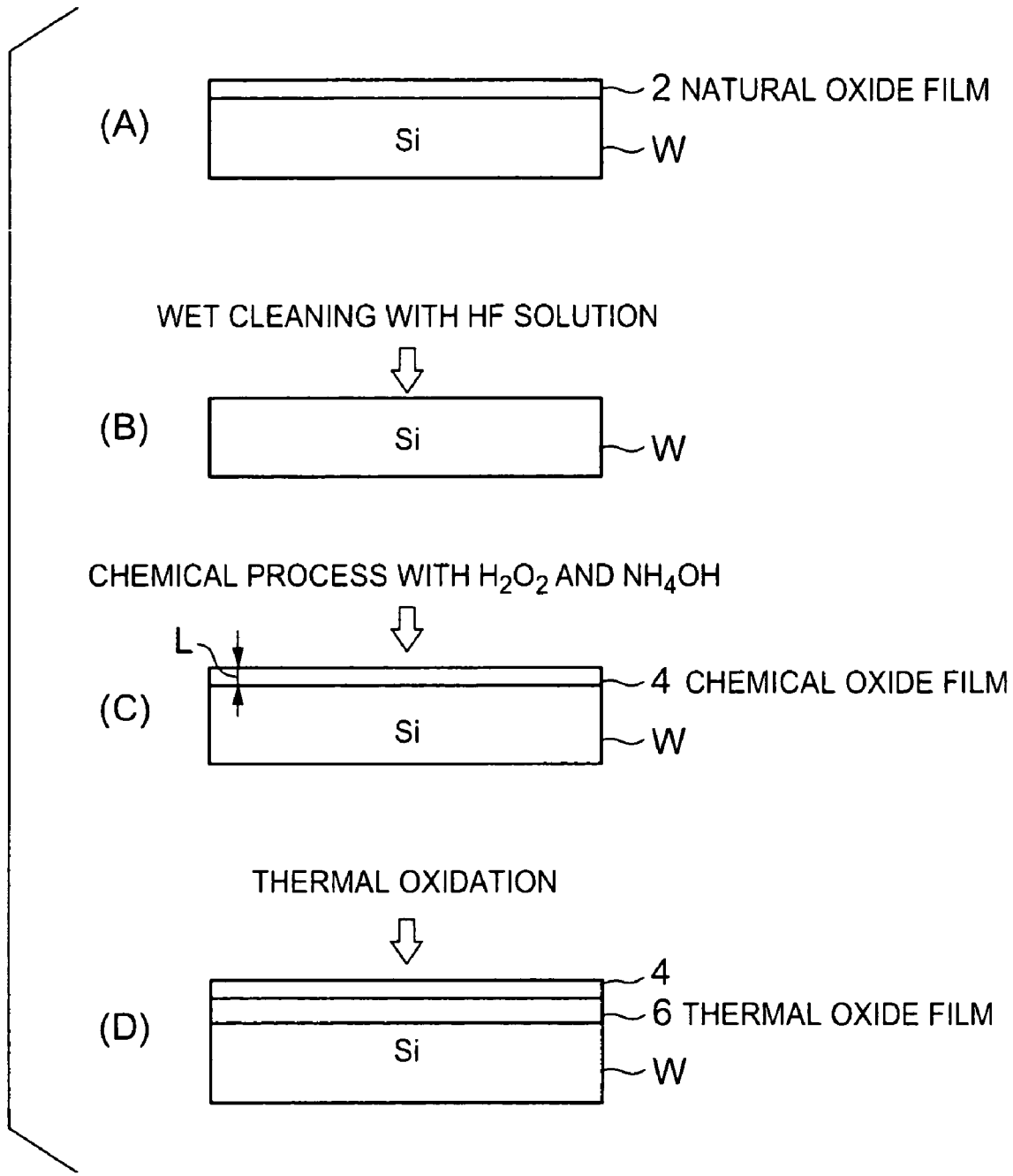
FIG. 10 is a view of assistance in explaining a series of steps of a process for processing a surface of a semiconductor wafer.

Referring to FIG. 9, the processing system includes, in addition to an HF gas supply system 38 and an $NH_3$ gas supply system 40, a silicon film forming gas supply system 90. The silicon film forming gas supply system 90 has a $SiH_4$ gas source 90A. The $SiH_4$ gas source 90A is connected to a gas nozzle 96A by a gas supply line 94A provided with a flow controller 92A. $SiH_4$ gas is supplied through the gas nozzle 96A into the processing vessel 18 when needed.

The processing system is provided with a $GeH_4$ gas source 90B to supply a dopant into the processing vessel 18. The $GeH_4$ gas source 90B is connected to a gas nozzle 96B by a gas supply line 94B provided with a flow controller 92B. $GeH_4$ gas is supplied through the gas nozzle 96B into the processing vessel 18 when needed.

A silicon film (polysilicon film) doped with germanium, namely, a dopant, can be formed by supplying $SiH_4$ gas and $GeH_4$ gas into the processing vessel 18.

First, the processing system shown in FIG. 9 supplies HF gas and $NH_3$ gas into the processing vessel 18 to remove chemical oxide films covering the surfaces of the silicon wafers. Then, the processing system supplies $SiH_4$ gas and $GeH_4$ gas into the processing vessel 18 to form a silicon film doped with germanium, namely, a dopant. Thus, the processing system shown in FIG. 9 is capable of continuously carrying out processes for removing a chemical oxide film and forming a doped silicon film. An epitaxial film doped with germanium can be formed by properly determining a processing temperature. A processing system capable of continuously carrying out a chemical oxide film removing process, a gate oxide film forming process and a silicon gate electrode forming process can be constructed by combining the processing systems shown in FIGS. 8 and 9.

Although processes for forming a thermal oxide film and a silicon film doped with germanium to be carried out after removing a chemical oxide film have been described by way of example, a metal film, a nitride film or an insulating film may be formed after removing a chemical oxide film. The foregoing processes may be continuously carried out after removing, for example, a thermal oxide film instead of a chemical oxide film by the method according to the present invention.

The foregoing processing system in the embodiment including the double-wall processing vessel is only an example. The present invention is applicable to, for example, a processing system including a single-wall processing vessel. Each process gas is supplied through the lower end (or the upper end) of the single-wall processing vessel and the processing vessel is evacuated through the upper end (or the lower end) of the single-wall processing vessel.

The present invention is not limited to a batch type processing vessel capable of simultaneously processing a plurality of semiconductor wafers by an oxidation process. The present invention is applicable to a single-wafer processing system that places a single wafer on a support table (support means) placed in a processing vessel and heats the wafer with a heating means, such as a heating lamp or a heating device, to process the wafer by an oxidation process.

The workpieces are not limited to semiconductor wafers; the processing system of the present invention is applicable to processing LCD substrates, glass substrates and such.

As apparent from the foregoing description, the silicon dioxide film removing method and the processing system according to the present invention has the following effects.

A silicon dioxide film formed on a surface of a workpiece can be efficiently removed by using a mixed gas containing HF gas and $NH_3$ gas.

A chemical oxide film can be etched at high etch selectivity to silicon and can be efficiently removed.

A chemical oxide film can be etched at high etch selectivity to silicon nitride film and can be efficiently removed.

A silicon dioxide oxide film, namely, chemical oxide film, can be etched at high selectivity to TEOS silicon dioxide film and can be efficiently removed.

A silicon dioxide film, namely, a chemical oxide film, can be etched at high etch selectivity to a thermal oxide film ($SiO_2$) and can be efficiently removed.

The invention claimed is:

1. A method of removing silicon dioxide films from a surface of a workpiece having a natural oxide film thereon, said method comprising:
removing the natural oxide film from the surface of the workpiece by a chemical process;
forming a chemical oxide film on the surface as a protective film after removal of the natural oxide film, the chemical oxide film being a silicon dioxide film formed by a chemical process using a solution prepared by mixing $H_2O_2$ and $NH_4OH$; and
removing the chemical oxide film from the surface of the workpiece, under conditions that:
a mixed gas containing HF gas and $NH_3$ gas is used;
a processing temperature for achieving etch selectivity for the chemical oxide film to silicon is in the range of 200° C. to 400° C.;
a processing pressure at which the workpiece is processed is in the range of 26 Pa (0.2 Torr) to 53,200 Pa (400 Torr); and
the flow rate ratio of HF gas to $NH_3$ gas is in the range of 10:1 to 1:50.

2. A method of removing silicon dioxide films from a surface of a workpiece having a natural oxide film thereon, said method comprising:
removing the natural oxide film from the surface of the workpiece by a chemical process;
forming a chemical oxide film on the surface as a protective film after removal of the natural oxide film, the chemical oxide film being a silicon dioxide film formed by a chemical process using a solution prepared by mixing $H_2O_2$ and $NH_4OH$; and
removing the chemical oxide film from the surface of the workpiece, under conditions that:
a mixed gas containing HF gas and $NH_3$ gas is used;
a processing temperature for achieving etch selectivity for the chemical oxide film to a silicon nitride film is in the range of 200° C. to 600° C.;
a processing pressure at which the workpiece is processed is not more than 53,200 Pa (400 Torr); and
the flow rate ratio of HF gas to $NH_3$ gas is in the range of 10:1 to 1:50.

3. A method of removing silicon dioxide films from a surface of a workpiece having a natural oxide film thereon, said method comprising:
removing the natural oxide film from the surface of the workpiece by a chemical process;
forming a chemical oxide film on the surface as a protective film after removal of the natural oxide film, the chemical oxide film being a silicon dioxide film formed by a chemical process using a solution prepared by mixing $H_2O_2$ and $NH_4OH$; and
removing the chemical oxide film from the surface of the workpiece under conditions that:
a mixed gas containing HF gas and $NH_3$ gas is used;
a processing temperature for achieving etch selectivity for the chemical oxide film to a silicon dioxide film, which has been formed by CVD (Chemical Vapor Deposition), is in the range of 200° C. to 400° C.;
a processing pressure at which the workpiece is processed is not more than 53,200 Pa (400 Torr); and
the flow rate ratio of HF gas to $NH_3$ gas is in the range of 10:1 to 1:50.

4. A method of removing silicon dioxide films from a surface of a workpiece having a natural oxide film thereon, said method comprising:
removing the natural oxide film from the surface of the workpiece by a chemical process;
forming a chemical oxide film on the surface as a protective film after removal of the natural oxide film, the chemical oxide film being a silicon dioxide film formed by a chemical process using a solution prepared by mixing $H_2O_2$ and $NH_4OH$; and
removing the chemical oxide film from the surface of the workpiece, under conditions that:
a mixed gas containing HF gas and $NH_3$ gas is used;
a processing temperature for achieving etch selectivity for the chemical oxide film to a thermal oxide film is in the range of 100° C. to 600° C.;
a processing pressure at which the workpiece is processed is not more than 53,200 Pa (400 Torr); and
the flow rate ratio of HF gas to $NH_3$ gas is in the range of 10:1 to 1:50.

5. The method of claim 1, further comprising:
forming a thermal oxide film on the surface after removal of the chemical oxide film, whereby the thermal oxide film is the only film on the surface.

6. The method of claim 2, further comprising:
forming a thermal oxide film on the surface after removal of the chemical oxide film, whereby the thermal oxide film is the only film on the surface.

7. The method of claim 3, further comprising:
forming a thermal oxide film on the surface after removal of the chemical oxide film, whereby the thermal oxide film is the only film on the surface.

8. The method of claim 4, further comprising:
forming a thermal oxide film on the surface after removal of the chemical oxide film, whereby the thermal oxide film is the only film on the surface.

* * * * *